US009513157B2

(12) United States Patent
Cohen et al.

(10) Patent No.: US 9,513,157 B2
(45) Date of Patent: Dec. 6, 2016

(54) SELECTIVE AUDIO/SOUND ASPECTS

(75) Inventors: Alexander J. Cohen, Mill Valley, CA (US); Edward K. Y. Jung, Bellevue, WA (US); Royce A. Levien, Lexington, MA (US); Robert W. Lord, Seattle, WA (US); Mark A. Malamud, Seattle, WA (US); William Henry Mangione-Smith, Kirkland, WA (US); John D. Rinaldo, Jr., Bellevue, WA (US); Clarence T. Tegreene, Bellevue, WA (US); Lowell L. Wood, Jr., Bellevue, WA (US)

(73) Assignee: Invention Science Fund I, LLC, Bellevue, WA (US)

( * ) Notice: Subject to any disclaimer, the term of this patent is extended or adjusted under 35 U.S.C. 154(b) by 0 days.

(21) Appl. No.: 12/924,276

(22) Filed: Sep. 22, 2010

(65) Prior Publication Data

US 2011/0069845 A1    Mar. 24, 2011

(51) Int. Cl.
*H04R 29/00* (2006.01)
*G01H 3/14* (2006.01)
*H04S 1/00* (2006.01)
*H03G 3/32* (2006.01)
*H03G 3/34* (2006.01)
*H04R 27/00* (2006.01)

(52) U.S. Cl.
CPC ........ *G01H 3/14* (2013.01); *H04S 1/00* (2013.01); *H03G 3/32* (2013.01); *H03G 3/34* (2013.01); *H04R 27/00* (2013.01)

(58) Field of Classification Search
CPC .............. H03G 3/32; H03G 3/24; G01H 3/14; H04R 27/00

USPC .................. 381/56–57, 74, 17, 73.1, 77
See application file for complete search history.

(56) References Cited

U.S. PATENT DOCUMENTS

| | | |
|---|---|---|
| RE28,560 E | 9/1975 | Fling |
| 5,175,769 A | 12/1992 | Hejna, Jr. et al. |
| 6,374,225 B1 | 4/2002 | Hejna, Jr. |
| 7,430,300 B2 * | 9/2008 | Vosburgh et al. ........... 381/376 |
| 7,636,930 B2 | 12/2009 | Chang |
| 7,643,641 B2 | 1/2010 | Haulick et al. |
| 7,656,287 B2 | 2/2010 | Albert et al. |
| 7,697,698 B2 | 4/2010 | Brown |
| 7,712,342 B2 | 5/2010 | Loughlin et al. |
| 7,903,826 B2 | 3/2011 | Boersma |
| 7,962,342 B1 | 6/2011 | Coughlan et al. |

(Continued)

OTHER PUBLICATIONS

U.S. Appl. No. 12/927,418, Cohen et al.

(Continued)

*Primary Examiner* — Disler Paul

(57) ABSTRACT

Certain aspects relate to providing an at least one audio source to at least one user. Certain aspects relate to selectively modifying an at least one first sound source to be provided to the at least one user, wherein the at least one first sound source is combined with an at least one second sound source, and wherein the selectively modifying is performed relative to the at least one audio source based at least in part on at least some specific information of the at least one first sound source. Other aspects relate to selectively modifying the at least one first sound source to be provided to the at least one user relative to the at least one second sound source based at least in part on at least some specific information of the at least one first sound source.

20 Claims, 11 Drawing Sheets

(56) References Cited

U.S. PATENT DOCUMENTS

| | | | |
|---|---|---|---|
| 8,050,541 B2 | 11/2011 | Gilbert et al. | |
| 8,594,341 B2* | 11/2013 | Rothschild | H04H 60/04 381/123 |
| 2001/0000540 A1 | 4/2001 | Cooper et al. | |
| 2001/0046304 A1* | 11/2001 | Rast | H04R 1/1041 381/74 |
| 2002/0141599 A1 | 10/2002 | Trajkovic et al. | |
| 2002/0150262 A1* | 10/2002 | Carter | 381/86 |
| 2003/0194096 A1* | 10/2003 | Kennedy | H04R 27/00 381/82 |
| 2003/0223602 A1 | 12/2003 | Eichler et al. | |
| 2004/0165730 A1* | 8/2004 | Crockett | G10L 15/04 381/56 |
| 2005/0074131 A1 | 4/2005 | Mc Call et al. | |
| 2005/0117771 A1 | 6/2005 | Vosburgh et al. | |
| 2005/0213771 A1* | 9/2005 | Smaragdis et al. | 381/56 |
| 2005/0232436 A1 | 10/2005 | Nagayasu et al. | |
| 2005/0232445 A1 | 10/2005 | Vaudrey et al. | |
| 2006/0083387 A1* | 4/2006 | Emoto | H04R 1/1083 381/73.1 |
| 2006/0083388 A1* | 4/2006 | Rothschild | H04H 60/04 381/81 |
| 2006/0147055 A1 | 7/2006 | Ise | |
| 2007/0003078 A1 | 1/2007 | Escott et al. | |
| 2007/0092087 A1* | 4/2007 | Bothra | H04M 1/6058 381/74 |
| 2007/0127734 A1 | 6/2007 | Brulle-Drews | |
| 2007/0223717 A1 | 9/2007 | Boersma | |
| 2007/0237349 A1 | 10/2007 | Donaldson et al. | |
| 2008/0226087 A1 | 9/2008 | Kinghorn | |
| 2008/0267416 A1 | 10/2008 | Goldstein et al. | |
| 2009/0154712 A1 | 6/2009 | Morii et al. | |

OTHER PUBLICATIONS

U.S. Appl. No. 12/924,279, Cohen et al.
U.S. Appl. No. 12/924,278, Cohen et al.
"Active noise control"; Wikipedia.org; bearing a date of Nov. 15, 2006; printed on Dec. 5, 2006; pp. 1-2; located at http://en.wikipedia.org/wiki/Active_noise_cancellation.
Floridamanatee; "Selective hearing headphones, Not what spouses & kids have built-in"; Halfbakery.com; bearing a date of Mar. 10, 2003: printed on Nov. 6, 2006; pp. I; located at http://www.halfbakery.com/idea/Selective_20hearing_20headphones.
"Noise-cancelling headphone"; Wikipedia.org; bearing a date of Dec. 4, 2006; printed on Nov. 5, 2006; pp. 1-3; located at http://en.wikipedia.org/wiki/Noise-cancelling_headphone.

* cited by examiner

100 at least partially limiting/reducing an at least one second sound source and/or an at least one audio source relative to an at least one audio source 650

FIG. 8 at least partially amplifying an at least one first sound source relative to an at least one second sound source and/or an at least one audio source 750

FIG. 9

Legend to
FIG. 10

| FIG. 10a |
| FIG. 10b |
| FIG. 10c |

2000 providing an audio source to at least one user 2002 selectively modifying an at least one first sound source to be provided to the at least one user, wherein the at least one first sound source is combined with an at least one second sound source, and wherein the selectively modifying is performed relative to the at least one audio source based at least in part on at least some specific information of the at least one first sound source 2004 selectively modifying the at least one first sound source to be provided to the at least one user, wherein the at least one first sound source is combined with the at least one second sound source, and wherein the selectively modifying is performed relative to the at least one second sound source and the at least one audio source 2010 selectively reducing the at least one audio source relative to the at least one first sound source 2012 selectively stopping the at least one audio source relative to the at least one first sound source 2014 selectively filtering the at least one audio source relative to the at least one first sound source 2016 selectively relatively maintaining the at least one first sound source as the at least one audio source is reduced, diminished, or cut 2018

Legend to FIG. 10:
- FIG. 10a
- FIG. 10b
- FIG. 10c

2000

(A)

reducing a volume of the at least one audio source at least partially in response to at least some outside classes of sound 2020 wherein the at least one first sound source at least partially includes a noise 2022 wherein the at least one first sound source at least partially includes a recorded or synthesized audio 2024 wherein the at least one first sound source at least partially includes a voice 2026 wherein the at least one second sound source at least partially includes an ambient sound 2028 wherein the at least one second sound source at least partially includes a recorded or synthesized audio 2030 wherein the at least one second sound source at least partially includes a voice 2032 wherein the at least one audio source is presented over a headphone 2034 wherein the at least one audio source is presented over a speaker system 2036

Legend to FIG. 11
| FIG.11a |
| FIG.11b |
| FIG.11c | providing an at least one audio source to at least one user 2202 selectively modifying an at least one first sound source to be provided to the at least one user, wherein the at least one first sound source is combined with an at least one second sound source, and wherein the selectively modifying is performed relative to the at least one second sound source based at least in part on at least some specific information of the at least one first sound source 2204

- selectively reducing the at least one second sound source relative to the at least one first sound source 2210
- selectively stopping the at least one second sound source relative to the at least one first sound source 2212
- selectively filtering the at least one second sound source relative to the at least one first sound source 2214
- selectively maintaining the at least one first sound source as the at least one second sound source is diminished or stopped 2216

(C)

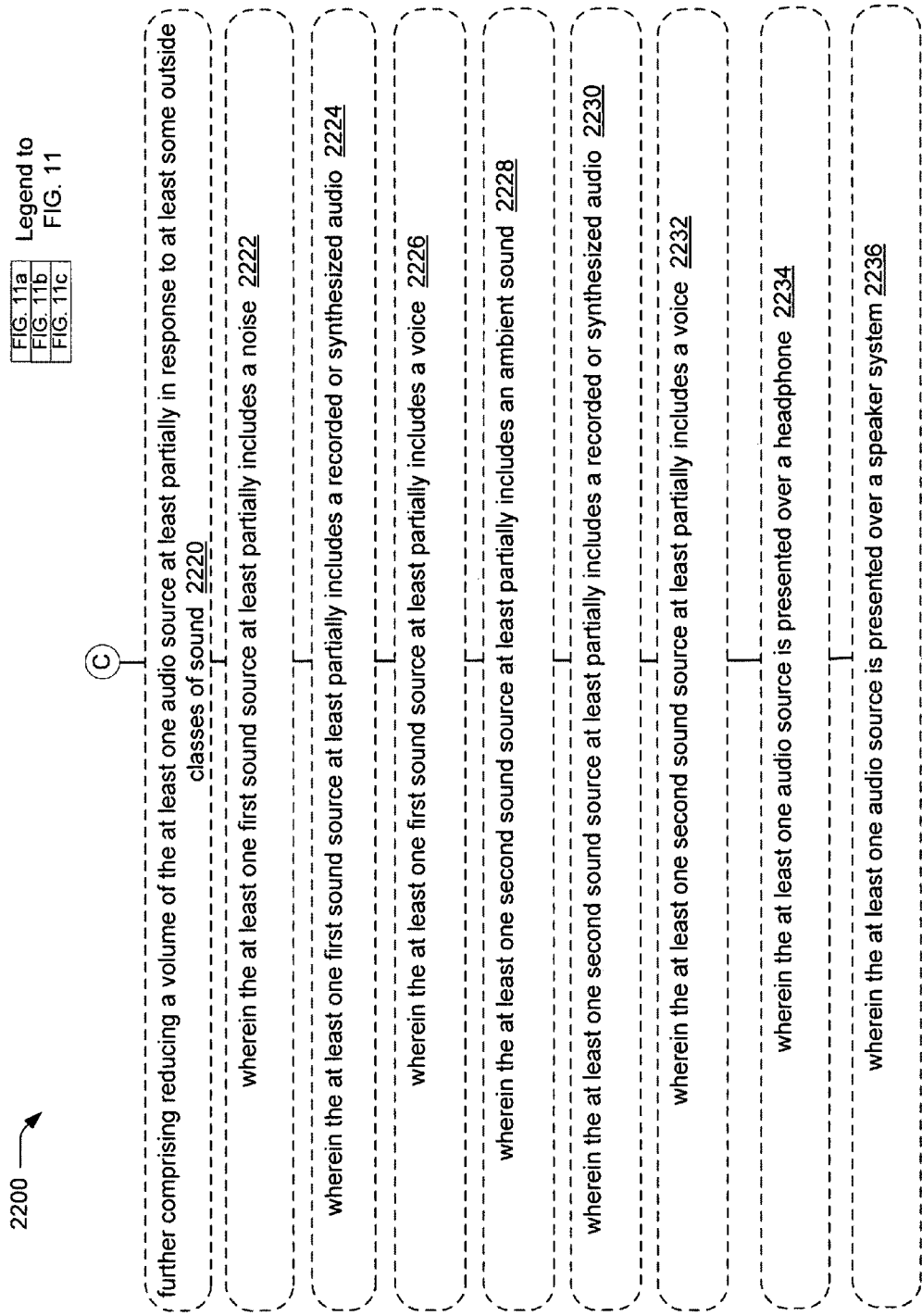

SELECTIVE AUDIO/SOUND ASPECTS

CROSS REFERENCE TO RELATED APPLICATIONS

For purposes of the USPTO extra-statutory requirements, the present application constitutes a continuation of U.S. patent application Ser. No. 11/634,521, entitled SELECTIVE AUDIO/SOUND ASPECTS, naming Alexander J. Cohen, Edward K. Y. Jung, Royce A. Levien, Robert W. Lord, Mark A: Malamud, William Henry Mangione-Smith, John D. Rinaldo, Jr., Clarence T. Tegreene, and Lowell L. Wood, Jr. as inventors, filed 5 Dec. 2006, which is currently co-pending, or is an application of which a currently co-pending application is entitled to the benefit of the fling date.

TECHNICAL FIELD

Certain aspects of this disclosure can relate to, but are not limited to, an audio/sound device that can selectively filter certain audio and/or sound.

BRIEF DESCRIPTION OF THE FIGURES

FIG. 8 is a flow chart of one embodiments of an audio/sound technique;

FIG. 9 is a flow chart of another embodiment of an audio/sound technique;

DETAILED DESCRIPTION

At least certain portions of the text of this disclosure (e.g., claims and/or detailed description and/or drawings as set forth herein) can support various different applications. Although, for sake of convenience and understanding, the detailed description includes section headings that generally track the general concepts as contained in one or more claims, and is not intended to limit the scope of the invention as set forth by each particular claim. It is to be understood that support for the various applications thereby can appear throughout the text and/or drawings, and/or in the claims, irrespective of the section headings.

Figure 1:
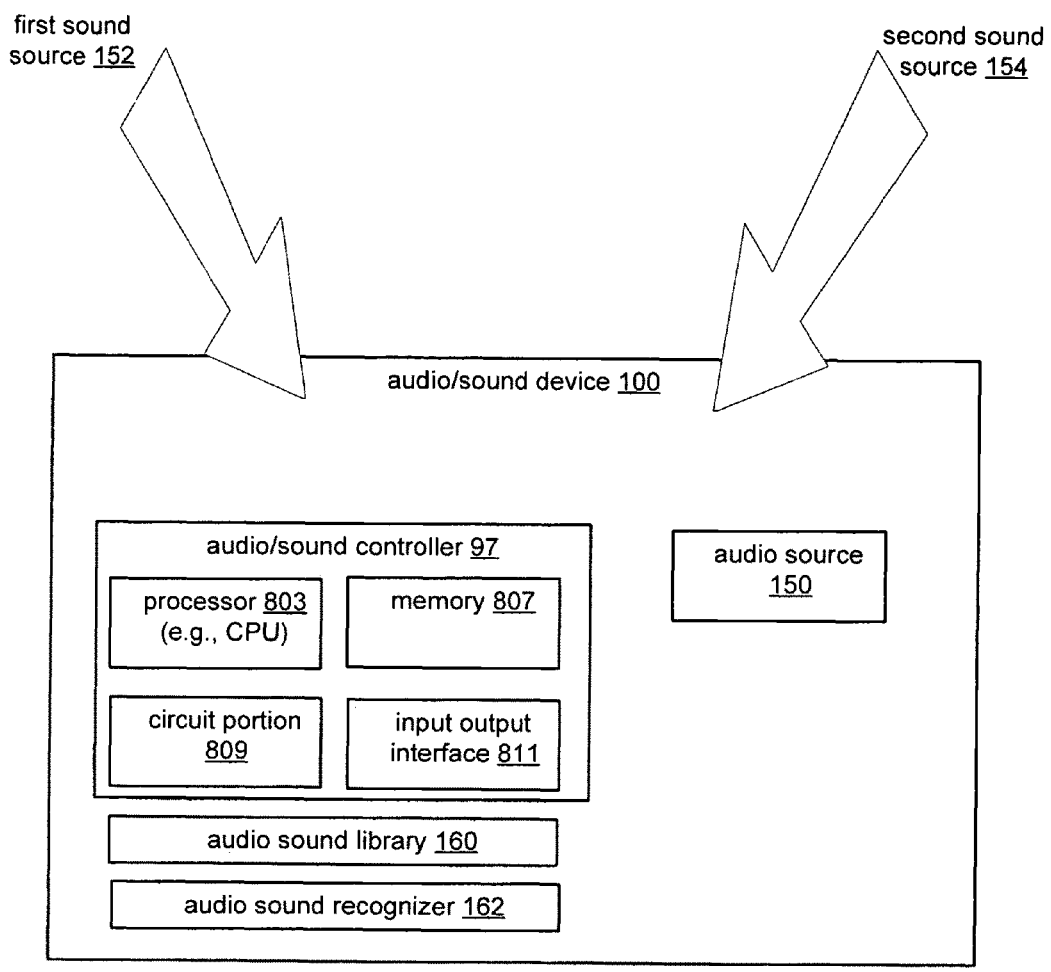
FIG. 1 is a block diagram of one embodiment of an audio/sound device.

This disclosure can relate to a variety of embodiments of an audio/sound device 100 that can be utilized by a person; certain of the embodiments are as described in block format with respect to FIG. 1, and at other locations through the disclosure. Certain embodiments at particular applications of the audio/sound device are described, for example, with respect to FIGS. 3, 4, 5, 6, and 7, as well as at other locations through this disclosure. Certain embodiments of the audio/sound device 100 can include an at least one audio source 150, an at least one first sound source 152, and an at least one second sound source 154. The various embodiments of the audio/sound device 100 (as well as the respective sources 150, 152, and 154) as described in this disclosure are intended to be illustrative in nature, but not limiting in scope.

Certain embodiments of the audio/sound device 100 as described with respect to FIG. 1, in block format, can be used for a considerable variety of application involving providing one or more of: relative maintaining, relative reducing, relative diminishing, relative amplification, and other relative processing of one or more of the one or more audio source 150, the one or more first sound source 152, and/or the one or more second sound source 154, as described in this disclosure.

There may be a variety of types or classifications of sounds and/or audio corresponding to the at least one audio source 150, the at least one first sound source 152, and/or the at least one second sound source 154 that can be associated with certain embodiments of the audio/sound device that may be desired or expected by user(s) to be heard during particular periods or for prescribed directions. For instance, the at least one audio source 150 may represent the audio portion that can be heard, or is intended or designed to be heard, during normal operations of the audio/sound device 100. For example, the at least one audio source 150 may include audio for a personal audio device such as a personal computer, laptop, IPOD player, MP3 player, etc. Additionally, the at least one audio source may include speakers, mixers, amplifiers, etc. that may be used for concert systems, music systems, home entertainment units, etc. that may be heard by multiple persons. It may be desired that the at least one audio source be heard during at least some normal operation of certain embodiments of the audio/sound device.

It may also be desired that audio, or other sounds or noises corresponding to the at least one audio source 150, can be diminished, stopped, or reduced with certain embodiments of the audio/sound device 100 during certain durations such as when an emergency vehicle passes, when a loud horn or screeching tires occur, or perhaps even in certain embodiments when a particular noise, sound, or voice (or range thereof) occurs such as when a particular person is talking to the user of the audio/sound device 100. The sound characteristics (or range of characteristics) of the audio and/or sound can be stored or maintained in an audio/sound library 160 as described with respect to FIG. 1. As such, certain embodiments of the audio/sound device 100 as provided within certain embodiments of the audio sound recognizer 162 as described with respect to FIG. 1 can be used to digitize and/or characterize particular sounds, voices, noises, etc. Such sounds, voices, noises, etc., as recognized by certain embodiments of the audio sound recognizer 162, can be characterized based at least in part on the frequency, volume, direction, consistency, or other such characteristics. Such characterization of the sounds, voices, noises, etc. that are obtained by the audio sound recognizer 162 can thereupon be compared to prescribed limits that such as can be contained in certain embodiments of the audio/sound library 160. For example, for a siren or alert sound, a prescribed range of sounds within a range of frequencies, volumes, etc. as obtained by the audio sound recognizer 162 can be compared to, or classified as, sirens, alerts, emergency sounds, etc. that can be maintained, stored, and/or retrieved in certain embodiments of the audio/sound library 160. As such, a sound emanating from a siren or alarm, etc. that can be obtained by the audio sound recognizer 162 of the audio/sound device 100, that falls within the classification of sirens within the audio/sound library 160, can be characterized or recognized as a siren, alarm, alert, etc. by certain embodiments of the audio/sound device 100, and can be recognized and handled appropriately. Certain embodiments of the audio/sound device can also detect and/or indicate a direction of the direction or angle of the siren or other sound with respect to the user, using certain embodiments of directional sound clues, as described in this disclosure with respect to FIG. 2, for example.

Figure 2:
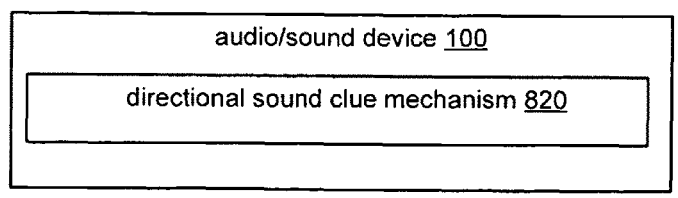
FIG. 2 is a diagram of one embodiment of a directional sound clue mechanism as can be utilized with certain audio/sound devices.

If an actual siren is recognized by the audio sound recognizer as corresponding to these siren frequency, volume, and/or other characteristics of an emergency siren, etc., then the sound will be recognized and identified as the siren of the audio/sound library 160; whereupon the audio/sound device might be actuated such as to amplify, maintain, or otherwise emphasize the siren sound as well as provide a directional sound clue as described with respect to FIG. 2 (which may correspond to the at least one first sound source 152) with respect to the at least one second sound source 154 and/or the at least one audio source 150, as described in this disclosure.

Similarly, a voice, or other identifiable noise or sound, could be obtained, digitized, processed, and/or otherwise utilized by certain embodiments of the audio sound recognizer 162, which can thereupon be compared to the respective voice, or other noise or sound range information as may be stored or otherwise maintained in the audio/sound library 160. If the voice corresponds, to the voice range information is included or maintained in the audio sound library 160, then the voice can be amplified, maintained, and/or otherwise emphasized as the first sound source 152 as described in this disclosure. As such, prescribed voices, etc. (that may be characteristically associated with a particular person) that falls within the classification of frequency or other characteristics for a particular person within the audio/sound library should be recognized as the voice of that particular person by certain embodiments of the audio/sound device 100, and handled appropriately by the audio/sound device 100.

Such additional sounds, voices, or noises may be characterized in certain aspects of this disclosure as the at least one first sound source 152, which can, depending on context, represent that noise, voice, or sound that is not produced by the audio/sound device 100 during normal operation, but which the user of the audio/sound device may still have a desire to listen or hear. In certain embodiments of the audio/sound device 100, it may be desired to enhance such as by amplification the at least one first sound source 152 relative to the audio source 150 and/or the at least one second sound source 152. Certain embodiments of the relative emphasis between various sources 150, 152, and/or 154 can take a variety of forms including but not limited to, amplification of the first sound source 150; manufacturing the first sound source 152 as the second sound source 154 and/or the audio source is diminished or cut, etc.

The at least one second sound source 154 can, depending on context, include those noises, sounds, voices, ambient sounds, vehicle noise, white noise, etc. that are not provided by the audio/sound device to which the user of the system may not particularly wish of may to listen, or may decide to limit the presentation thereof. Alternatively the second sound source may obscure and/or distract the first sound source 152 and/or the audio source 150 during normal operation of the audio/sound device 100. Certain aspects of the audio/sound device 100 may thereby be configured to relatively reduce the effects of the at least one second sound source 154, while relatively enhancing the effects of the first sound source 152.

In certain instances the at least one second sound source 154 may thereby include, but not be limited to, ambient noises, extraneous voices, vehicle noises, stray voices, etc. that may otherwise interfere with the ability of the user of the audio/sound device to listen to or hear the at least one audio source 150 and/or the at least one first sound source 152. As such, it may be desired to relatively diminish the volume or other effects of the second sound source 154 relative to the first sound source 152 and/or the audio source 150. Certain embodiments of commercially-available noise cancellation systems, such as are utilized and are commercially available in aircraft, manufacturing applications, as well as other applications where there may be considerable noise, and the noise being cancelled in such commercially available devices may represent a combination of the at least one second sound source 154 and the at least one first sound source; which together may be cancelled in combination by such commercially-available noise cancellation systems.

Another technique that can be used to emphasize certain embodiments of the at least one first sound source 152 with respect to the at least one second sound source 154 and/or the at least one audio source 150 can include delaying and re-presentation of the at least one second sound source 152. For example, a voice can be spoken, a siren or aural alert can recorded and identified, or recognized as, the at least one first sound source 152, the at least one first sound source can be digitized, recorded, and/or delayed; and thereupon the at least one delayed version of the at least one first sound source 152 can be reproduced, represented, or replayed, etc. such as may be selected as being appropriate for certain embodiments of the audio/sound device 100. Such re-presentation of the first sound source 152 can be provided at a time when the at least one second sound source 154 and/or the at least one audio source 150 is diminished, or cut. As such, by representing the first sound source 152 at a substantially even or amplified level as compared to the original level as the at least one second sound source 154 and/or the at least one audio source 150 is diminished will allow the at least one first sound source 150 to be better heard.

In certain embodiments of the audio/sound device 100, the at least one audio source 150 and/or the at least one second sound source 154 can be reduced, muted, and/or cut during the representation of the at least one first sound source 152, thereby further emphasizing the at least one first sound source 152. Certain representations of the at least one first sound source 152 can occur multiple times to further emphasize the first sound source.

Certain embodiments of the audio/sound device 100 may utilize noise cancelling systems (which may include noise cancelling headphones) to reduce ambient noise and thereby allow improved hearing of the at least one audio source 150 and/or the at least one first sound source 152. Certain commercially-available active noise cancellation systems, such as noise-cancelling headphones, can reduce unwanted ambient sounds (i.e., acoustic noise) by means of active noise control. By comparison, certain passive noise cancellation headphones and/or systems can rely at least partially on sound insulative material, acoustic insulative material, and/or shape of the headphone and/or system to limit sound being applied to the user. Certain ones of the active noise cancellation headphones and/or systems can be combined with passive noise cancellation headphones and/or systems.

Essentially, certain active noise cancellation headphones and/or systems (either commercially available or embodiments of the audio/sound device 100) can utilize a microphone positioned nearby the ear of the user to detect noise or sound that can be obtained by the user. Certain active-noise cancellation headphones and/or systems can utilize circuitry (including hardware, firmware, and/or software based on design choice or expediency) to generate an "anti-noise" sinusoidal sound wave having the opposite sinusoidal polarity as the sinusoidal sound wave that can be combined with the detected noise to be applied to the user(s)' ears. The detected noise and/or sound can thereby destructively interfere with the "anti-noise" sinusoidal sound wave, thereby largely cancelling out the noise within the enclosed volume of the headphone. Reducing noise prescribed at the user(s)' ear using certain active noise cancellation headphones and/or systems (either commercially available or embodiments of the audio/sound device 100), makes it possible to hear, detect, and enjoy the audio, sound, voice(s), etc. without raising the volume of the audio/sound device 100 unnecessarily. It can also help limit the volume of the sound, audio, voice, and/or noise being applied to the user in a noisy environment such as a vehicle such as an aircraft, a factory, proximate a noisy machine, etc.

Certain active noise cancellation headphones and/or systems only cancel the lower-frequency portions of the noise; that can depend upon passive noise cancellation techniques (such as ear-cups of headsets) to prevent higher-frequency noise from reaching the interior of the headphone.

This approach benefits the user since the technological demands and/or design of the electronic circuitry are simplified; because of the shorter wavelength of the high-frequency sound, active cancellation is much less effective at higher frequencies. To effectively cancel high frequency components (directed towards at the ear from a number of directions), the sensor and emitter for the cancelling waveform should be as close as practicable to the user's ear(s).

Certain active noise cancellation headphones and/or systems (either commercially available or embodiments of the audio/sound device 100) have several characteristics including but not limited to: a) they consume power, which can be provided by a battery or other power source, b) they may be optimized for sounds that are continuous, such as the noise or hum of an engine, vehicle, or piece of equipment, but may be rather ineffective against rapidly changing audio signals such as speech, alarms, etc.; d) they may introduce additional noise, perhaps in the form of high-frequency hiss; and/or they may pick up and convert stray electromagnetic fields, such as a mobile phone signal, into unwanted noise.

Certain embodiments of the audio/sound device, as described in this disclosure, can considerably reduce the at least one second sound source 154 while maintaining, enhancing, or even amplifying the at least one first sound source 152. Therefore, the sounds of certain embodiments of the at least one second sound source 154 that may be heard by the user of the audio/sound device may be desired to be diminished as much as practicable.

Certain embodiments of the audio/sound device 100 can be configured to allow the user, operator, owner, or other person or automated mechanism to select or determine the frequencies, types, characteristics, and/or other aspects of the at least one first sound source 152 and/or the at least one second sound source 154, and thereby determine which of the sound sources should be relatively diminished, relatively accented, relatively amplified, relatively filtered, and/or have some other suitable relative operation performed thereupon. While the at least one first sound source 152 and the at least one second sound source 154 may appear in FIG. 1 as being presented from outside of the audio/sound device, in certain instances, the sound from either of the sound source(s) 152 or 154 can alternatively originate at least partially outside of the audio/sound device, at least partially internally to the audio/sound device, entirely within the audio/sound device, and/or a combination thereof. Certain embodiments of at least portions of an audio/sound controller 97 can additionally utilize hardware, software, and firmware, as well as mechanical, electromechanical, or other structure(s) to provide an effective interface with the user, owner, or other person, as well as providing some suitable automated or self-control mechanism.

Within this disclosure, certain embodiments of the sound source(s) (which within this disclosure can include, but is not limited to, the at least one first sound source 152 and/or the at least one second sound source 154) can take a variety of forms such as to be capable of performing a variety of functions. For instance, certain embodiments of the sound source(s) can include, but are not limited to, recording, storing, digitizing, accessing, playing, and/or otherwise processing one or more natural or recorded or synthesized voices, noises, and/or sounds made by persons; one or more natural or recorded or synthesized sounds or noises made by objects (e.g., sirens, hazard sounds, machine sounds, buzzers, recorded or synthesized voices, etc.), as well as one or more natural or recorded or synthesized sounds or noises made by animals or things. These embodiments of the sound sources may be digitized, recorded or synthesized, analyzed, or otherwise processed using certain embodiments of such audio conversion, voice conversion, sound conversion, or other similar conversion devices involving but not limited to microphones, recording, computing, signal analyzing processing and/or other similar equipment as generally understood by those skilled in audio technologies in a manner as described with respect to the audio/sound controller 97, as described in this disclosure.

In certain embodiments of the audio/sound device 100 as described in this disclosure, certain embodiments of the at least one first sound source 152 can represent, depending on context, certain sounds, voices, noises, etc. to which the user of the audio/sound device desires to hear or listen. For example, it may be desired for the user of certain embodiments of the audio/sound device 100 to hear or understand the at least one first sound source 152 perhaps even over the at least one audio source 150 and/or the at least one second sound source 154, thereby allowing for the relative emphasis of the at least one first sound source 152 relative to the at least one second sound source 154 and/or the at least one audio source 150.

It should be understood that certain embodiments of the at least one first sound source 152 and the at least one second sound source 154 can each take a variety of forms, but as described relative to this disclosure, both the at least one first sound source 152 and the at least one second sound source 154 can be considered inclusively, depending upon context, as sound sources. Certain embodiments of the sound source (s) can utilize such information, signal, or data transfer mechanisms as may include, but are not limited to, sound data streams, sound signals, or other acoustic computer-based information that can be readily played on an audio system, stored, recalled, transmitted, received, filtered, analyzed, or otherwise processed. The recalling of at least some of the sound source(s) in certain embodiments of the audio/ sound device 100 can be at least partially controlled by the user(s), and can occur as they occur or are received, or alternately can be automated.

With certain embodiments of an audio/sound device 100, the at least one first sound source 152 can be in some manner combined with the at least one second sound source 154. Such combination of at least some of the sound sources 152 and 154 can take a variety of forms, such as output from the at least one first sound source 152 being mixed, and/or otherwise combined, with output from the at least one second sound source 154. In addition, the at least one first sound source 152 and/or the at least one second sound source 154 can include but are not limited to external noises or sound, ambient noises are sound, etc. that may be allowed to be combined.

In this disclosure, certain embodiments of the at least one audio source 150 can include that portion of the audio/sound device 100 which provides during normal operations the intended audio or sound to the audio/sound device 100. There can be a variety of the at least one audio sources 150, and a variety of applications therefore, as are described in this disclosure. For example, certain embodiments of the audio/sound device 100, can include, but are not limited to, a purely audio device which may be personal, such as an IPOD, MP3 player, a personal computer audio system, (PC) or laptop computer audio system, or certain home audio systems. Certain embodiments of the audio/sound device 100 can be configured to include the speakers, headphones, amplifiers, etc. that can thereby be utilized to provide the audio and/or sound to the one or more people listening to the audio/sound device.

Certain embodiments of the audio/sound device 100 can also provide directional sound clues. Humans rely to a considerable extent on hearing to not only determine a direction from which voices, noises, sounds, etc. are originating from; in addition to the actual contents of the voices, noises, sounds, etc. Within this disclosure, the directional sound clues can indicate, depending on context, which direction from which at least some noise, sound, voices, etc. are originating. Often, the at least one second sound source 154 as well as the at least one audio source 150 can act to hide or confuse the direction of the at least one second sound source relative to the individual. The directional sound clues may be appropriate to determine the orientation of the second sound source 152 relative to the individual. It is understood by those skilled in the audio art that certain conventional sound systems, surround sound systems, personal audio devices, stereo audio devices, headphone devices, etc. can project sound that can appear to one or more users to originate from a variety of locations or angles relative to one or more users. Using similar technology, in a manner understood by those skilled in audio technology, certain embodiments of the audio/sound device can direct the at least one audio source 150 and/or the at least one first sound source 152 to provide at least some directional clues, as described in this disclosure. In the case of voices, the directional sound clue can indicate a direction of the person speaking. In the case of sounds, the directional sound clues can thereby provide a clue as to the direction of the sound in certain embodiments of the audio/sound device. In the case of an emergency vehicle or hazard, the directional sound clues can provide a clue as to the direction of the emergency vehicle or hazard.

The selection of which sounds, noises, voices, etc. that can be characterized as the at least one first sound source 152 as compared with the at least one second sound source 154 may be a design choice, or may be configurable by the user, producer, and/or designer of certain embodiments of the audio/sound device 100. For instance, certain personalized embodiments of the audio/sound device 100 can be configured to allow certain users to input voice samples corresponding to those persons that the user wishes to hear, or have conversation with, into the audio sound library 160 such as can be easily recognized over, for example, crowd voices, ambient noises, and other less significant sounds. It might be expected that parents might input the voices of their children into the audio sound library 160 of the audio/sound device, such that these voices may be emphasized relative to other voices or sounds.

By comparison, certain sirens, alarms, alerts, etc. may be provided by the provider of certain embodiments of the audio/sound device, since certain providers could more fully be able to determine which sounds, generally, fall within emergency sounds, siren sounds, etc. Certain embodiments of such emergency, alert, siren, or other such sounds may be characterized and maintained within certain embodiments of the audio sound library, and compared to the sound of the siren, emergency, alert, etc. that can be obtained by the certain embodiments of the audio sound recognizer 162 as described with respect to FIG. 1.

Certain embodiments of a directional sound clue mechanism 820 as described with respect to FIG. 2, can provide directional clues as to the position, or angle, of the at least first sounds source with respect to the user. Users of conventional sound or audio devices such as IPODS, car radios, CD players, surround sound systems, etc. can have a variety of directional sound clues diminished or obscured, especially if the audio, sound, or noise is particularly loud. As such, can provide an indication to users of the audio/sound device 100, as to a direction from which the at least one first sound source 152 originated.

Certain embodiments of the directional sound clue mechanism 820 can include a multi-directional audio presentation device 822, that can present sound, audio, and/or noise in a direction or angle as described. As such, the at least one first sound source 152 should, appear to originate from a particular direction corresponding to the original sound, voice, etc., even if the first sound source is filtered, amplified, modified, and/or otherwise processed.

There may be a considerable variety of the audio/sound device 100 that can operate or are structured in a manner similar to as described with respect to FIG. 1, a number of which are now described. Certain embodiments of the audio/sound device 100 can be utilized as described with respect to FIGS. 3, 4, 5, 6, and/or 7, as well as at other locations in this disclosure. Certain embodiments of the audio/sound device 100 can be usable to provide audio to one or more person(s), and in certain embodiments groups of persons, at least partially using one or more embodiments of the selective sound/audio provider 102. Within these embodiments of the audio/sound device 100 as described with respect to FIGS. 3, 4, 5, 6, and/or 7, the location of the at least one audio source 150, the at least one first sound source 152, and/or the at least one second sound source 154 may not be illustrated, but are intended to be determinable according to the operation of the audio/sound device 100.

Figure 3:
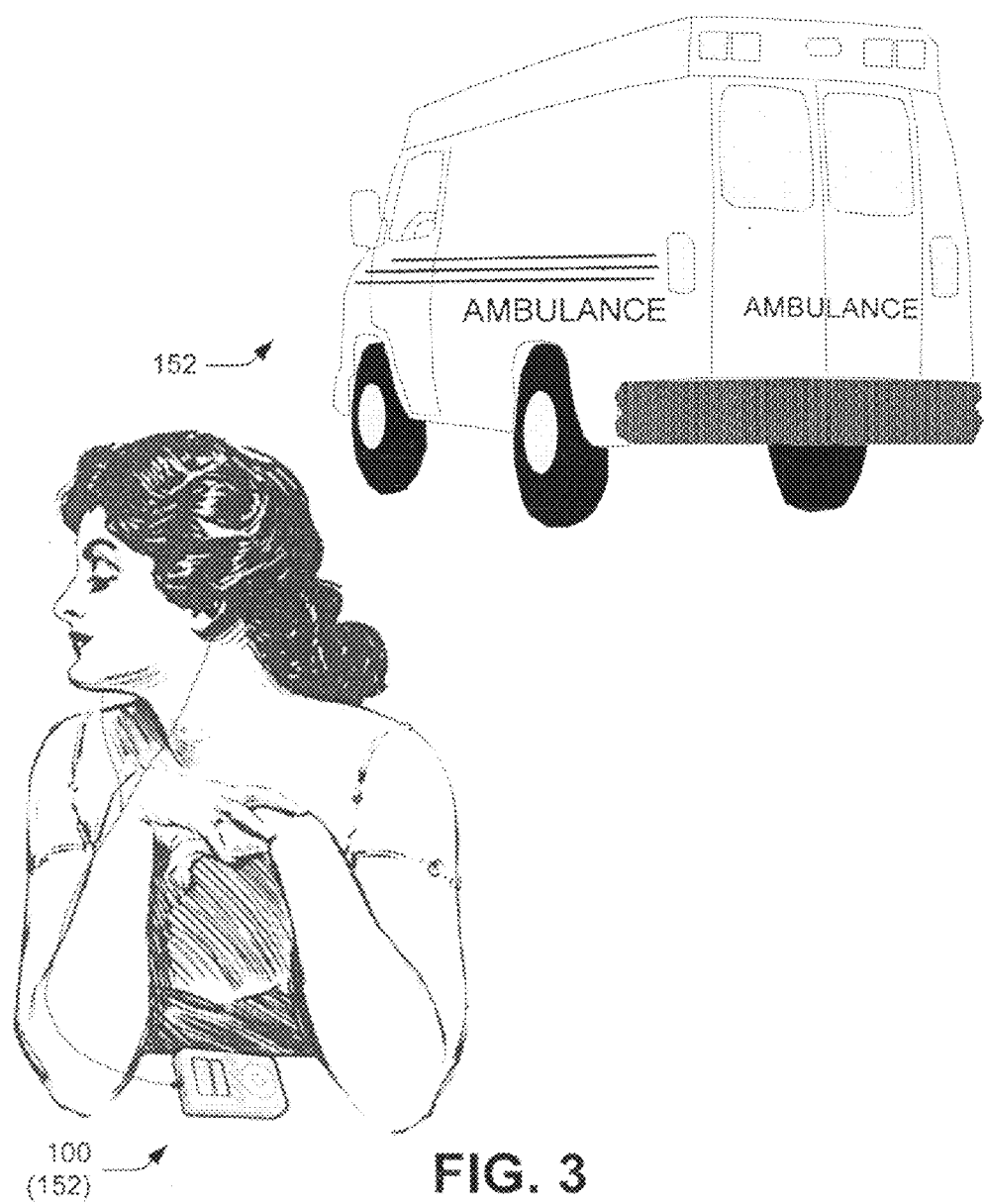
FIG. 3 is a diagram of one embodiment of an audio/sound device.

For instance, with an embodiment of the audio/sound device 100 that can be configured as a personal audio device such as an IPOD, MP3 player, transistor radio, etc., as described with respect to FIG. 3, it is envisioned that the at least one audio source(s) 150 can include the audio that can normally be provided by the audio/sound device 100. By comparison, the at least one first sound source 152 can include, but may not be limited to, those sounds, noises, voices, etc. that originate from outside of the audio/sound device 100 that the user of the audio/sound device may wish to hear, such as sirens, alarms, certain voices, etc. As such, a user walking down the street, in the office, in the home, or in other such locations can listen to particular important noises (e.g., sirens, alerts, voices, etc.) or voices, while they do not have to listen to other noises, voices, etc. Additionally, the at least one second sound source can include, but may not be limited to, those noises, sounds, voices, etc. outside of the audio/sound device 100 that the user of the audio/sound device may not wish to hear.

As described with respect to FIG. 3, certain embodiments of the audio/sound device 100 can be configured as a personal audio/sound device 150 that can provide at least one audio source 150 that can typically be used by a single user, but in certain instances may be used by more than one person. Examples of the personal audio/sound device 150 at least one audio source 150 can include, but is not limited to, an devices that may appear as, or may include the at least one audio source 150 that can operate similar to, for example, the audio portions of IPODs, personalized audio players, personalized radios, an MP3 player (which are commercially available), etc., such as to include a headphone, earplug, and/or other audio providing system that can enable at least one user to listen to audio, sounds, music, noises, etc.

Certain embodiments of the audio/sound device 100, may thereby be configured as a personal device, and can thereby as with other embodiments of the audio/sound device 150 limit the transmission of the second sound source 154 and/or the audio source 150 relative to the first sound source 152, as described with respect to FIG. 1 as well as at other locations in this disclosure. With certain embodiments of the personalized audio/sound device 100, the user can configure certain of those sounds of the at least one first sound source 152 that the user wishes to have emphasized relative to the at least one second sound source 154 and/or the at least one audio source 150, such as by recording voices of friends, family, etc. that can be included in the audio sound library 160 as described with respect to FIG. 1. With certain embodiments of the personalized audio/sound device 100, the device provider, producer, or administrator can configure certain of those sounds of the at least one first sound source 152 that should be emphasized relative to the at least one second sound source 154 and/or the at least one audio source 150, such as by determining those particular or range of sounds, noises, voices, etc. that can be characterized as falling within the at least one first sound source, as described in this disclosure. As such, certain individual audio listeners might utilize certain embodiments of the selective sound/audio provider 102.

Figure 4:
FIG. 4 is a diagram of one embodiment of the audio/sound device.

Certain embodiments of the audio/sound device 100 can provide a variety of audio sources and/or sound sources 150, 152, and/or 154 (as described with respect to FIG. 1) to a number of uses such as with a concert, a speech, a speaker phone, a speaker-based audio system, and/or other multiple user audio/sound system as described with respect to FIG. 4. With certain group embodiments of the audio/sound device 100, it is still possible to provide particular individualized settings for the members of the group members. For example, voices of certain children, spouses, friends, etc. who may get lost in crowds, etc., may have their voices recorded and maintained in the audio sound library 160 of certain embodiments of the audio/sound device 100, and if their voice is raised to a particular level, then they may be emphasized above the volume of the other group members.

Additionally, certain performers, speakers, musical instruments, etc., may have their voices, noises, sounds, etc. characterized as a first sound source 152, and such voices, noises, sounds, etc. can thereupon be amplified, maintained, or otherwise emphasized above other voices, noises, sounds, etc. During a live concert, for example, the performers and their instruments may be classified as the first sound source (s), and certain group embodiments of the audio/sound device 100 can relatively filter out, cancel, reduce the other noises of the audience or stage, and thereupon relatively emphasize (either through amplification or not) the at least one first sound source 152 corresponding to the voices or sounds of the performers, speakers, instruments, etc. Additionally, in a live concert or speech, certain group-based embodiments of the audio/sound device can be configured to reduce amplified or normal voices, noises, sounds, etc. corresponding to the audio sound source(s) 150 and/or the second sound source(s) 154 in those instances where an emergency sound, voice, noise, siren, alarm, etc. is detected by the audio sound recognizer 162 as described with respect to FIG. 1.

Certain embodiments of the audio/sound device 150 may thereby be utilized by one person, or a group of people in such environments as the home, the office, in concerts, with speeches, outdoors, in which audio and/or sound is being projected to one or more people, or groups of people. With those audio/sound device(s) 150 that are being utilized by a group of people, the volume, contacts, or other characteristics of the sound, voices, noises, etc. that can be characterized as the at least one first sound source 152, such as can be maintained in, retrieved from, or otherwise utilized by the audio sound library 160, can often selected by one or more people. Often a number of users of certain group embodiments of the audio/sound device 100 may have relatively little input into changing the sound characteristics contained in the audio sound library 160 of the audio/sound device. With certain embodiments of audio/sound device(s) 150 that can be used by groups of users, at least some of the users may be provided with headphones, earplugs, or a controllable gradient of sound and/or audio that may be distinctly controlled such as to provide for different embodiments of the at least one first sound source 152, at least partially by each particular user.

As described with respect to FIG. 4, certain embodiments of the audio/sound device 100 can thereby be configured as a group audio/source, such as to provide sound for a group of people such as in concerts, speeches, events, etc. As such, certain group members might utilize certain individualized embodiments of the selective sound/audio provider 102. With such embodiments of the audio/sound device 100 such as may be usable by groups of people, etc., the audio/sound device 100 can be configured to include the speakers and/or amplifiers, and/or the associated component, which can be utilized to provide audio and/or sound to the groups of people listening to the audio/sound device.

Figure 5:
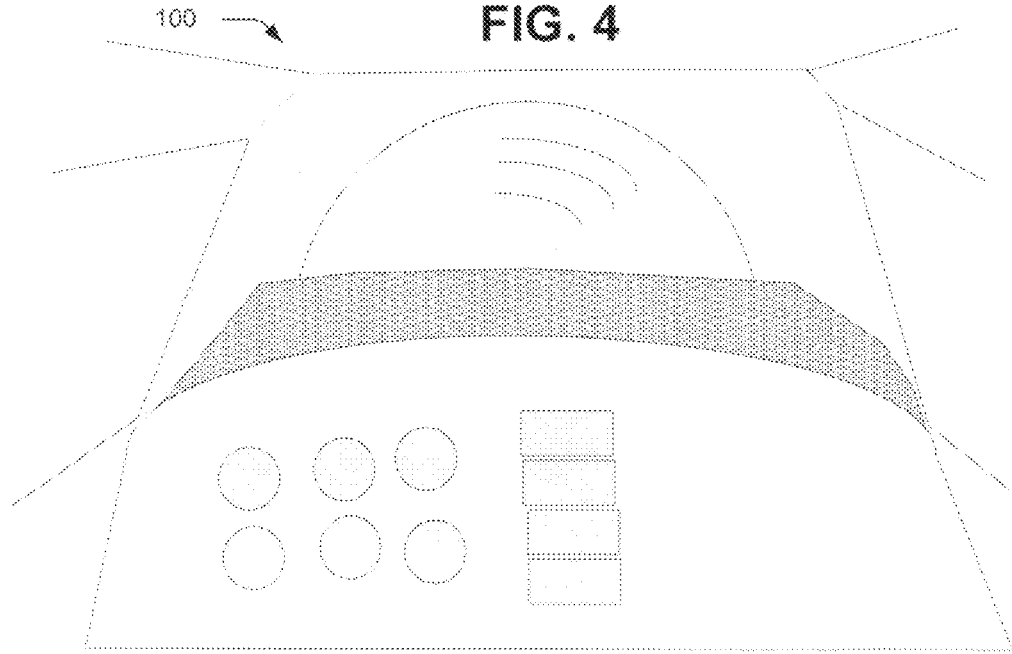
FIG. 5 is a diagram of one embodiment of the audio/sound device.

As described with respect to FIG. 5, certain embodiments of the audio/sound device 100 can be configured as at least on audio source which can be used by users within a vehicle (particularly noisy ones) such as a car, truck, bus, train, aircraft, ship, boat, military vehicle, etc. Certain embodiments of the audio/sound device 100 can thereby be situated in such vehicle. As such, certain drivers, operators, or occupants of the vehicle might utilize certain embodiments of the selective sound/audio provider 102. There may be a variety of sounds or noises that are peculiar to vehicle traffic, while certain embodiments of the audio/sound device can experience sounds or noises that are common to other types of audio sound device(s) (e.g., voices of people speaking).

With certain vehicular-based audio/sound devices 100, certain individuals could have their voices characterized as at least one first sound source 152. For example, a large ship or aircraft may be equipped with certain embodiments of the audio/sound device 100. A captain or officer on a large ship might thereupon have their voice characterized as the at least one first sound source 152, and such as to be emphasized above the ambient sound, the at least one audio source 150, and/or the at least one second sound source 154. Such amplification of the captain's of officer's voice may be presented at prescribed locations throughout the ship regardless of the physical location of the captain or officer. Certain embodiments of audio, sound, voices, etc. may be shared between multiple devices, such as may be similar to as described with respect to the following audio sharing application entitled: Audio Sharing, U.S. application Ser. No. 11/210,284 (incorporated herein by reference in its entirety). In addition, certain other people on the vehicle such as the ship of aircraft may have their voices presented to other locations regardless of their location based, at least in part, on having their voices characterized as first sound source(s) as maintained in certain embodiments of the audio sound library 160, as described with respect to FIG. 1.

Figure 7:
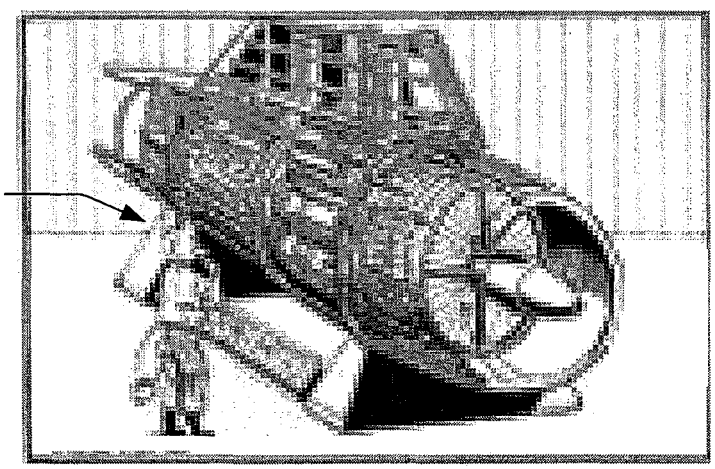
FIG. 7 is a diagram of another embodiment of the audio/sound device.

FIG. 7 shows another embodiment of the audio/sound device 100 that is configured to be applied to industrial (particularly) environments. It is generally understood that a variety of industries can be quite noisy, and as such can utilize a variety of noise cancellation technologies. For instance, such industrial locations as factories, fabrication, construction, power generation, aircraft loading or unloading, riveting, robotics, turbines, road working equipment, etc. can provide a considerable amount of noise by their very operation. While FIG. 7 illustrates a user utilizing certain embodiments of audio/sound device 100 as described with respect to FIG. 1 such as earplugs, earmuffs, etc, who is positioned in close proximity to a power generation device (e.g., a jet engine), it should be understood that such audio/sound devices can be applied to users position in other industrial environments.

It may be is difficult to communicate with others within noisy areas (industrial, commercial, concerts, etc.) as a result of the environmental noise. To thereby limit the amount of noise, certain embodiments of the audio/sound device(s) 100 can thereby be configured as noise cancelling devices (headphones) by which the user can reduce some of the noise applied thereto. In a similar manner as the voice of the captain or officer of the ship being emphasized relative to other voices; so can certain foremen, subordinates, co-workers, or other persons have their voices characterized as at least one first sound source 152 in one or more audio/sound device(s) 100, and thereby emphasize their voice relative to others or relative to the ambient or other noises or sounds.

Additionally, it may be dangerous for certain workers or other persons to be situated at various locations within the work area. As such, certain alarms, alerts, hazards, etc. can be provided as first sound source(s), such as to be relatively emphasized, amplified, maintained, etc. relative to other sounds that can be included in the at least one second sound source(s) 154 and/or at least one audio source(s) 150. As such, users of certain embodiments of the audio/sound source(s) can receive enhanced hazard, emergency, and other warnings in their workplace and/or other noisy environments. Certain embodiments of the audio/sound device can also provide 1-way or 2-way radio communication (e.g., similar to a walky-talky, cellular telephone, computer-device, communication device, etc.), and certain ones of such communications can be characterized as the at least one audio source 150, the at least one first audio source 152, and/or the at least one second audio source 154 as described in this disclosure.

Certain embodiments of vehicles can provide a considerable amount of noise from such sources as road noise, wind, weather, music, audio/radio hiss or distortions, etc. and such undesirable or secondary noises could be characterized as certain embodiments of the at least one second sound source(s) 154 as described with respect to FIG. A1. Certain vehicular based embodiments of the audio/sound device could be configured to lessen the impact of such additional noises while allowing the users/drivers/operators, etc. to detect certain emergency vehicle sirens or noises, desired voices, etc. As such, certain embodiments of the audio/sound device can be configured to utilize or provide noise cancellation characteristics, similar to commercially available noise cancellation headphones.

Certain vehicular-based embodiments of the audio/sound device 100 can also enhance directional sound clues. For example, drives of cars, truck, ships, aircraft can each rely on location of outside sirens, yells, horns, other vehicle noises, etc. (e.g. first sound source) such as may be difficult to hear over the ambient vehicle noise (e.g. second sound source) and/or the audio source (e.g. car or vehicle radio, etc.). Such directional sound clues are especially significant with vehicle audio/sound devices 100, since detecting sound from particular directions may affect how the vehicle is operable.

Other non-vehicular embodiments of the audio/sound device 100 can also be configured to provide directional sound clues. Consider that conventional personal or group sound systems may be played so loudly as to obscure directions of secondary audio. Certain embodiments of the audio/sound device(s) can allow the users to obtain such directional clues either by limiting external sounds or alternately by enhancing some indication as to which direction from which certain sounds, voices, machines, horns etc. (or other embodiments of the first said source(s) 152 originated.

In addition, certain embodiments of the audio/sound device 100 can be utilized as a portion of video systems, television systems, graphic systems, computer systems or other systems. For example, as described with respect to FIG. 6, certain embodiments of the audio/sound device 100 can be configured as an audio/video source such as to provide visual information in both audio and video formats (which may be typically expected to be synchronized). For example, certain embodiments of the audio/sound device 100 can include, but not limited to, a portion of such systems as: a television system, a display system (e.g., a liquid crystal display (LCD) or plasma display), a computer-based system, a personal display assistant (PDA) system, etc., a vehicular system (e.g., in a truck, car, aircraft, railroad, bus, ship, military vehicle, etc.), a communication system, a controller-based system, etc. Certain embodiments of the audio/sound device 100 can thereby be utilized as portions of the systems may interface with the other portions of the systems in a variety of manners. Consider that certain embodiments of the audio/sound device 100 integrated in the television, display, or computer system as described with respect to FIG. 6 could reduce, cut, stop, or mute its audio source (output) if such an at least one first sound source 152 as an emergency sound was detected such as a siren or alert. In addition, if certain persons have their voice characterized as first sound source(s), as they speak, certain embodiments of the audio/sound device can relatively diminish the audio (or relatively enhance their voices).

Figure 6:
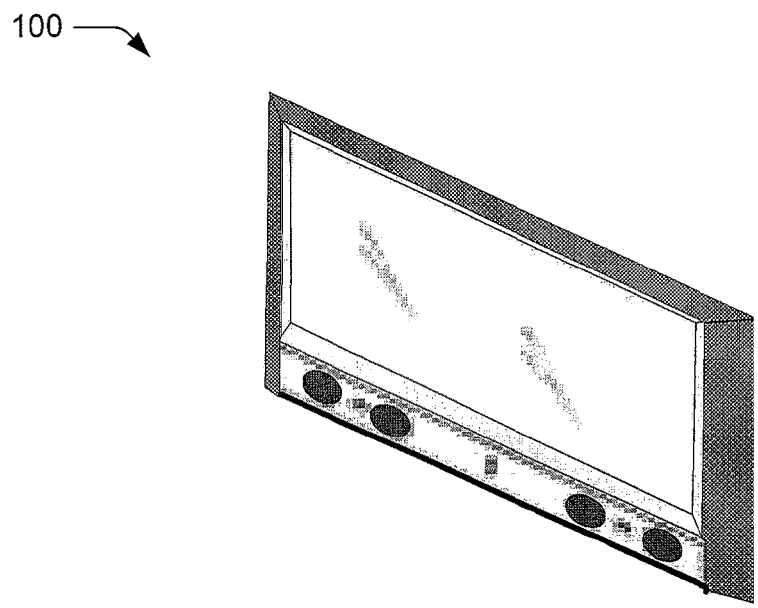
FIG. 6 is a diagram of one embodiment of the audio/sound device.

With certain system embodiments of the audio/sound device that include a display portion as described with respect to FIG. 6, if operation of the audio source 150 (e.g., audio output) is muted or cease, then the corresponding video, television, display, etc. can also be ceased or frozen. In this manner, a speaker having their voice being identified as the first sound source will not act to diminish or cut the audio of certain embodiments of the audio/sound device 100 each time they talk; but may instead cause the program to freeze or stop, and the audio and video may continue together when the discussion ends.

As described in flow chart form with respect to FIGS. 8 and 9, certain embodiments of the audio/sound device can utilize at least one or more from two options such as to emphasize the at least one first sound source 152 relative to the at least one second sound source 154 and/or the at least one audio source 150. In certain embodiments, as described with respect to operation 650 of FIG. 8, the emphasizing of the at least one first sound source 152 can result by at least partially limiting/reducing the at least one second sound source 154 and/or the at least one audio source 150 relative to the at least one audio source, such as by filtering the sound relative to the second interruptive (audible) at least one audio source.

In other embodiments, the emphasizing of the at least one first sound source 152 as described with respect to operation 750 as described with respect to FIG. 9, can result by at least partially amplifying the at least one first sound source relative to the at least one second sound source 154 and/or the at least one audio source 150, and in certain instances that at least one first sound source 152 may be mixed or combined with the at least one second sound source 154 or the at least one audio source 150.

Certain embodiments of the audio/sound device 100 can thereby be configured such as to include content filters, such as to allow differentiation of one or more of the at least one first sound source 152, the at least one second sound source 154, and/or the at least one audio source 150. In certain instances, the one or more of the at least one first sound source 152, the at least one second sound source 154, and/or the at least one audio source 150 can be individually sampled, digitized, filtered, enhanced, amplified, sustained, or otherwise suitably processed. Certain embodiments of the audio/sound device can thereby be considered to include content-based filters, e.g., that can be configured to operate the at least one first sound source 152, the at least one second sound source 154, and/or the at least one audio source 150 at certain prescribed or controllable levels. As such, certain embodiments of the audio/sound device 100 can be configured to allow some content in but not other content.

Certain embodiments of the audio/sound device 100 can be configured to operate other than to emphasize the at least one first sound source 152 relative to the at least one second sound source 154 and/or the at least one audio source 150. For instance, certain embodiments of the audio/sound device 100 can be configured to de-emphasize or filter out the at least one first sound source 152 relative to the at least one second sound source 154 and/or the at least one audio source 150. Consider that certain embodiments of the audio/sound device 100 could be programmed to hear certain voices or sounds (such as from the at least one first sound source 152), amplify those voices sounds, and transmit them (or representative versions thereof) into the listened-to audio stream. One example can include certain users of the audio sound device 100 that are programmed to recognize the voice of a person or noise that is not desired to listen to, and effectively filter the voice or sound; such as with use of a volume increase of the at least one audio source 150 relative to the at least one first sound source.

Certain embodiments of the audio/sound device 100 can be configured to interface with the phone. For instance, certain embodiments of the audio/sound device 100 incorporating a phone can "hear" the phone (such as by auditory or electronic signaling means such as via a network connection and out-of band communications), and thereafter diminish or in extreme instances turn off the phone, and allows the at least one first sound source 152, that may be configured as real world sound, to pass through as described with respect to FIG. 9. Alternatively, certain embodiments of the audio/sound device including the phone can be configured to boost the at least one first sound source 152 being presented to the user, while temporarily reducing noise from the phone.

Consider that certain embodiments of the audio/sound device could be considered as a selective enhancement to listening device that amplifies sounds or voices with certain prescribed characteristics, and relatively de-emphasized of certain voices, sounds, noises, etc. with other characteristics. Such characteristics can be based on the frequency, volume, direction, of other characteristic of the voices, noises, sounds, etc. As such, certain embodiments of the audio/sound device 100 should be considered to be content savvy and responsive some input from the user, or in certain instances some pre-configuration by others than the user.

Certain embodiments of the audio/sound device 100 can utilize headphones, ear cups, earplugs, or other devices that can provide sound directly to one or more users. Certain embodiments of the audio/sound device 100 that include headphones or earplugs can provide logic and processing capabilities as associated with the audio/sound controller 97 either in the audio/sound device 100, in the headphones, or in a combination thereof.

Certain embodiments of the audio/sound device may be configured to provide for mixing of audio signals and/or sound signals. Certain embodiments of the audio/sound device 100 can thereby be configured to allow the at least one first sound source 152 to be emphasized or de-emphasized relative to the at least one second sound source 154 and/or the at least one audio source 150. As such, the at least one first sound source 152 may thereby be allowed to be at least partially listened to, or alternately may be desired not to listen to or to filter out.

Certain of the technologies utilized by certain embodiments of the audio/sound device 100 can be configured with similar processes or mechanisms as with conventional noise canceling devices or systems. Certain conventional noise canceling devices or systems, which are commercially available, may be used in such applications where it is desired to actively filter certain noises out such as with aviation, industrial equipment, road working, etc. Such companies as Bose, David Clark, Softcomm, among others, design and provide commercially available active noise canceling systems (which may be configured to represent certain commercially available versions or embodiments of the audio/sound device 100). Certain embodiments of the audio/sound device 100 can be configured as a noise cancelling system, as described in this disclosure. With such embodiments of the audio/sound device 100 that are configured as noise canceling systems, noise canceling headphones, noise canceling speakers, etc.

Certain embodiments of the audio/sound device 100, as described in this disclosure, can thereby be configured to limit any excessive noise, sound, etc. that can be classified as originating as the at least one second sound source 154, in a similar manner as conventional noise cancellation systems and devices can cancel or limit noise, sound, etc.

With certain embodiments of the audio/sound device 100, the at least one first sound source 152 can be modified such as by being amplified, sustained, etc. Examples of the modification of the at least one first sound source can include but are not limited to: filtering, amplifying, maintaining, sustaining, processing, etc. Such modification can be based, for example, at least in part on at least some specific spectrum of information, specific frequencies, specific spectral content, specific recognition-based, etc., of the at least one first sound source 152 relative to the at least one second sound source 154 and/or the at least one audio source. By comparison, certain embodiments of the audio/sound device 100, as described in this disclosure, can be configured to allow or enhance noise, sound, etc. that can be classified as originating as the at least one first sound source 152. Certain embodiments of the at least one first sound source 152 can be heard above the diminished at least one second sound source 154 during normal operation of the audio/sound device 100.

Such diminishing of the at least one second sound source relative 154 to the at least one first sound source 152 (or alternatively the amplification of the at least one first sound source relative to the at least one second sound source) can be especially desirable if the at least one first sound source 152 includes a voice of a person with whom the person using the audio/sound device 100 is attempting to communicate. The diminishing of the at least one second sound source 154 relative to the at least one first sound source 152 (or alternatively the amplification of the at least one first sound source relative to the at least one second sound source) can also be desirable if the at least one first sound source includes an emergency signal, noise, voice, etc. Therefore, in general, the diminishing of the at least one second sound source relative 154 to the at least one first sound source 152 (or alternatively the amplification of the at least one first sound source relative to the at least one second sound source) can also be desirable if the at least one first sound source corresponds to some desired sound to hear.

There can be a variety of mechanisms and/or techniques by which the at least one first sound source 152 can be enhanced, amplified, or maintained relative to the at least one second sound source 154. For example, a voice corresponding to the at least one first sound source can be digitalized, such as by using a microphone, an analog to digital converter, etc.

Certain Embodiments of the Audio/Sound Controller

This disclosure describes a number of embodiments of the audio/sound controller 97, as described with respect to FIG. 1, that is intended to control operations of certain embodiments of the audio/sound device 100. Certain embodiments of the audio/sound controller 97 can provide the functionality of the at least a portion of the feedback mechanism to either certain embodiments of the audio/sound device 100. Certain embodiments of the audio/sound controller 97 can be configured as a standalone device, while other embodiments of the audio/sound controller can be configured as a networked device or as multiple networked devices.

FIG. 1 shows a block diagram of certain respective embodiments of the audio/sound device 100 that can include the audio/sound controller 97, the at least one audio source 150, and possible interfaces with the at least one first sound source 152 and/or the at least one second sound source 154 as described in this disclosure. Certain embodiments of the audio/sound device 100 thereby can include, but are not limited to, any particular configuration of the audio/sound controller 97. Certain embodiments of the audio/sound controller 97 can be computer based, controller based, mote based, phone based, and/or electronics based. Certain embodiments of the audio/sound controller can be segmented into modules, and can utilize a variety of wireless or wired-based communication and/or networking technology to allow information, data, etc. to be transferred to the various distinct portions or embodiments of the audio/sound device 100. Certain embodiments of the audio/sound controller 97 can be configured as a unitary or stand alone device.

Certain embodiments of the audio/sound controller 97 can vary as to their automation, complexity, and/or sophistication. As described within this disclosure, multiple ones of the different embodiments of the audio/sound device 100 can transfer audio and/or sound data, information, etc. Certain embodiments of the audio/sound controller 97, as well as certain embodiments of the audio/sound device 100, in general, can utilize distinct firmware, hardware, and/or software technology. For example, mote-based technology, phone-based technology, microprocessor-based technology, microcomputer-based technology, general-purpose computer technology, specific-purpose to computer technology, and a variety of other computer technologies can be utilized for certain embodiments of the audio/sound controller 97, as well as certain embodiments of the audio/sound device 100.

Certain embodiments of the audio/sound controller 97 can as described with respect to FIG. 1 can include a processor 803 such as a central processing unit (CPU), a memory 807, a circuit or circuit portion 809, and an input output interface (I/O) 811 that may include a bus (not shown). Certain embodiments of the audio/sound controller 97 of the audio/sound device 100 can include and/or be a portion of a general-purpose computer, a specific-purpose computer, a microprocessor, a microcontroller, a phone, a personal display assistant (PDA), a cellular phone, a wireless communication device, a hard-wired phone, and/or any other known suitable type of communications device, computer, and/or controller that can be implemented in hardware, software, electromechanical devices, and/or firmware. Certain embodiments of the processor 803, as described with respect to FIG. 1, can perform the processing and arithmetic operations for certain embodiments of the audio/sound controller 97 of the audio/sound device 100. Certain embodiments of the audio/sound controller 97 of the audio/sound device 100 can control the signal processing, database querying and response, computational, timing, data transfer and other processes associated with certain embodiments of the audio/sound controller 97 of the audio/sound device 100.

Certain embodiments of the memory 807 of the audio/sound controller 97 can include a random access memory (RAM) and/or read only memory (ROM) that together can store the computer programs, operands, and other parameters that control the operation of certain embodiments of the audio/sound controller 97 of the audio/sound device 100. The memory 807 can be configurable to contain the information or individual information obtained, retained, or captured by that particular audio/sound controller 97 of the audio/sound device 100. Certain embodiments of the memory 807 can at least partially include the modifiable data/information memory locations, as described in this disclosure.

Certain embodiments of the bus can be configurable to provide for digital information transmissions between the processor 803, circuits 809, memory 807, I/O 811, and/or the image memory or storage device (which may be integrated or removable). In this disclosure, the memory 807 can be configurable as RAM, flash memory, semiconductor-based memory, of any other type of memory that can be configurable to store data pertaining to images. The bus also connects I/O 811 to the portions of certain embodiments of the audio/sound controller 97 of either the audio/sound device 100 that either receive digital information from, or transmit digital information to other portions of the audio/sound device 100 or other systems are networking components associated with.

Certain embodiments of the audio/sound controller 97 of the audio/sound device 100, as described with respect to FIG. 1, can include a transmitter portion (not shown) that can be either included as a portion of certain embodiments of the audio/sound controller 97 of the audio/sound device 100. Certain embodiments of the audio/sound controller 97 can alternately be provided as a separate unit (e.g., microprocessor-based). In certain embodiments, the transmitter portion can transmit image information between certain embodiments of the audio/sound controller 97 of the audio/sound device 100.

Certain embodiments of the audio/sound controller 97 of the audio/sound device 100 as described with respect to FIG. 1 can include an operation altering portion (not shown) that can be either included as a portion of certain embodiments of the audio/sound controller 97 of the audio/sound device 100 can be provided as a separate unit (e.g., microprocessor-based). Examples of operation altering portions include, but are not limited to, altering a resolution, altering a contextual library, altering an initial condition, altering an aspect ratio, altering a color intensity and/or brightness or particular parameter or characteristic of the audio/sound device 100.

Certain embodiments of the memory 807 can provide one example of a memory storage portion. In certain embodiments, the monitored value includes but is not limited to: a percentage of the memory 807, a number of images that are stored in the memory 807, or for data storage or recording interval (audio or video recording intervals).

To provide for overflow ability for the memory 807 of certain embodiments of the audio/sound controller 97 of the audio/sound device 100, the image storage device can be operably coupled to the memory 807 to allow a controllable transmitting of memory data from certain embodiments of the audio/sound controller 97 of the audio/sound device 100 when the monitored value of data within the memory 807 (e.g., the memory storage portion) exceeds a prescribed value. The prescribed value can include, e.g., some percentage amount or some actual amount of the value.

In certain embodiments, a secondary communication link can be established between the certain embodiments of the audio/sound controller 97 of the audio/sound device 100. The secondary communication link can be structured similar to as a communication link, or alternatively can utilize network-based computer connections, phone connections, Internet connections, etc. to provide information and/or data transfer between certain embodiments of the audio/sound controller 97 of the audio/sound device 100.

In certain embodiments of the audio/sound controller 97 of the audio/sound device 100, the particular elements of certain embodiments of the audio/sound controller 97 of the audio/sound device 100 (e.g., the processor 803, the memory 807, the circuits 809, and/or the I/O 811) can provide a monitoring function to convert raw data as displayed by an indicator. A monitoring function as provided by certain embodiments of the audio/sound controller 97 of the audio/sound device 100 can be compared to a prescribed limit, such as whether the number of images contained in the memory 807, the amount of data contained within the memory 807, or some other measure relating to the memory is approaching some value. The limits to the value can, in different embodiments, be controlled by the user or the manufacturer of certain embodiments of the audio/sound controller 97 of the audio/sound device 100. In certain embodiments, the memory 807 can store such information as data, information, displayable information, readable text, motion images, video images, and/or audio images, etc.

In certain embodiments, the I/O 811 provides an interface to control the transmissions of digital information between each of the components in certain embodiments of the audio/sound controller 97 of the audio/sound device 100. The I/O 811 also provides an interface between the components of certain embodiments of the audio/sound controller 97 of the audio/sound device 100. The circuits 809 can include such other user interface devices as a display and/or a keyboard. In other embodiments, the audio/sound controller 97 of the audio/sound device 100 can be constructed as a specific-purpose computer such as an application-specific integrated circuit (ASIC), a microprocessor, a microcomputer, or other similar devices. A variety of vehicles, factories, machines, medical devices, devices, locations, etc. could be configured as and/or include certain embodiments of the audio/sound device 100. A variety of vehicles, seats, etc. can also be configured with certain embodiments of the audio/sound device 100.

Certain Embodiments of Audio/Sound with Relevant Flowcharts

Within the disclosure, flow charts of the type described in this disclosure apply to method steps as performed by a computer or controller. The flow charts can also apply to apparatus devices, such as an antenna or a node associated therewith that can include, e.g., a general-purpose computer or specialized-purpose computer whose structure along with the software, firmware, electro-mechanical devices, and/or hardware, can perform the process or technique described in the flow chart.

FIG. 1 shows one embodiment of the audio/sound device 100, which can be configured to provide audio and/or sound to a user, owner, listener, etc. of the audio/sound device 100. Certain embodiments of the audio/sound device 100 can be configured as a personalized audio/sound device, a group audio/sound device, an audio/sound portion of an alternate device, a vehicular audio/sound device, a user audio/sound device, or another type of audio sound device similar to as described with respect to FIGS. 3 to 7, and at other locations within this disclosure. Certain embodiments of the audio/sound device may be configured to allow the user to hear or listen to a first audio/sound source, while relatively reducing or relatively enhancing a second audio/sound source.

Certain portions of different embodiments of the audio/sound device 100 can be under the control of the owner, or under the control of another person or device. For example, certain embodiments of the audio/sound device 100 can be actuated at prescribed times when an emergency vehicle is traveling past the user, or the user is talking with another person with whom they may wish to talk with, or alternatively may not wish to communicate or talk with.

Certain embodiments of the audio/sound can be utilized by the user, owner, or possessor of the card as the true owner utilizing a remote and/or automated mechanism. Certain embodiments of the audio/sound can also utilize positional information (such as GPS-derived information) to detect where the audio/sound device 100, as well as the associated owner or user is situated. In certain embodiments, the positional information can be transmitted between the personalized device and other computer, controller, or communication devices using networking or other communication techniques and/or systems.

Figure 10C:
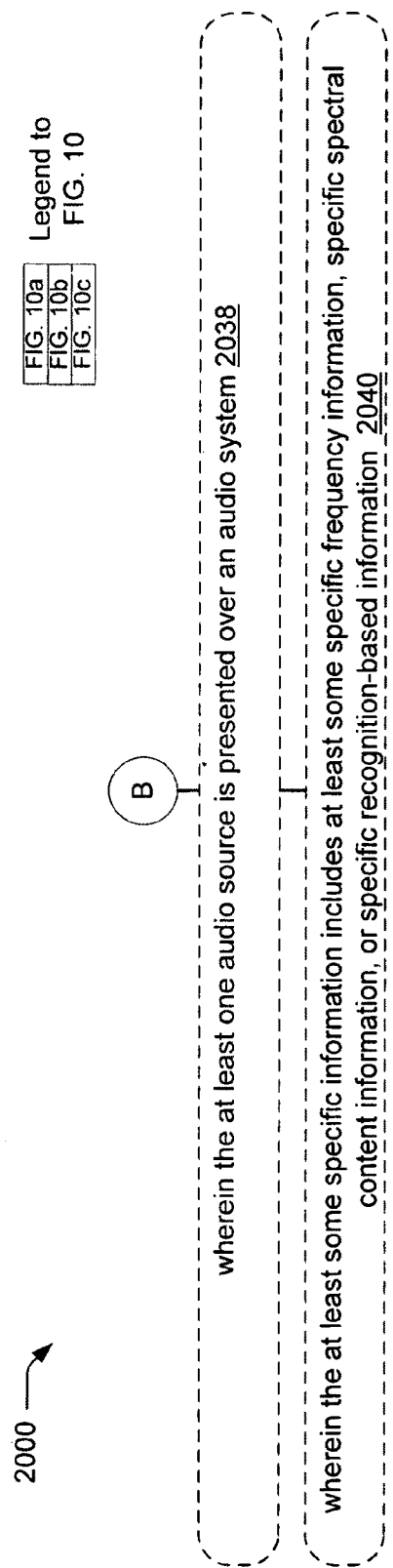
FIG. 10 (including FIGS. 10a, 10b, and 10c) is a flow chart of one embodiment of a technique such as can be performed by certain embodiments of the audio/sound device.

Certain embodiments of a high-level flowchart of a audio/sound technique 2000 is described with respect to FIG. 10 (including FIGS. 10a to 10c) and can include, but is not limited to, operations 2002 and 2004, and optional operations 2020, 2022, 2024, 2026, 2028, 2030, 2032, 2036, 2038, and/or 2040. Certain embodiments of operations 2004 can include, but is not limited to, optional operation 2010, 2012, 2014, 2016, and/or 2018. The high-level flowchart of FIG. 10 (including FIGS. 10a to 10c) should be considered in combination with the embodiments of the audio/sound device 100, as described with respect to FIG. 1.

Certain embodiments of operation 2002 can include, but is not limited to, providing an at least one audio source to at least one user. For example, the at least one audio source 150 can be provided within certain embodiments of the audio/sound device 100, as described with respect to FIGS. 1 and 2. Certain embodiments of the audio/sound device 100 are described in this disclosure with respect, to FIGS. 3 to 7. Certain embodiments of the audio/sound device can be configured to utilize hardware, firmware, and/or software versions of the audio/sound controller 97 as described in this disclosure. Certain embodiments of operation 2004 can include, but is not limited to, selectively modifying an at least one first sound source to be provided to the at least one user, wherein the at least one first sound source is combined with an at least one second sound source, and wherein the selectively modifying is performed relative to the at least one audio source based at least in part on at least some specific information of the at least one first sound source. For example, certain embodiments of the at least one first sound source 152 can be modified relative to the at least one second sound source 154. Certain embodiments of the modification can include, but are not limited to, amplification, maintaining, filtering, clarification, etc.

Certain embodiments of the selectively modifying an at least one first sound source to be provided to the at least one user, wherein the at least one first sound source is combined with an at least one second sound source, and wherein the selectively modifying is performed relative to the at least one audio source based at least in part on at least some specific information of the at least one first sound source of operation 2004 can include operation 2010, that can include but is not limited to, selectively modifying the at least one first sound source to be provided to the at least one user, wherein the at least one first sound source is combined with the at least one second sound source, and wherein the selectively modifying is performed relative to the at least one second sound source and the at least one audio source. For example, wherein the selective modification relative to the at least one audio source 150 is performed in combination with the selective modification relative to the at least one second sound source 154. Certain embodiments of operation 2004 can include operation 2012, that can include but is not limited to, selectively reducing the at least one audio source relative to the at least one first sound source. For example, the selective modification of the at least one first sound source 152 can include, but is not limited to, selective reduction of the at least one audio source 150 as described with respect to FIG. 1. Certain embodiments of operation 2004 can include operation 2014, that can include but is not limited to, selectively stopping the at least one audio source relative to the at least one first sound source. For example, the selective modification of the at least one first sound source 152 can include, but is not limited to, cutting or stopping the at least one audio source 150 as described with respect to FIG. A1. Certain embodiments of the operation 2004 can include operation 2016, that can include but is not limited to, selectively filtering the at least one audio source relative to the at least one first sound source. For example, the selective modification of the at least one first sound source 152 can include, but is not limited to, selectively filtering the at least one audio source 150 relative to the at least one first sound source 152. Certain embodiments of operation 2004 can include operation 2018, that can include but is not limited to, selectively relatively maintaining the at least one first sound source as the at least one audio source is reduced, diminished, or cut. For example, the selective modification of the at least one first sound source 152 can include, but is not limited to, relatively maintaining the at least one first sound source as the relative amplitude of the at least one audio sound source 150 is reduced, diminished, or cut.

Certain embodiments of operation 2020 can include, but is not limited to, further comprising reducing a volume of the at least one audio source at least partially in response to at least some outside classes of sound. For example, reducing the volume of the at least one audio source 150 relative to the at least one first sound source 152, the at least one audio source including a different type or class of sound as compared to the class or type of sound of the at least one audio source 150. Certain embodiments of operation 2022 can include, but is not limited to, wherein the at least one first sound source at least partially includes a noise. For example, wherein the at least one first sound source 152 at least partially includes a noise. Certain embodiments of operation 2024 can include, but is not limited to, wherein the at least one first sound source at least partially includes a recorded or synthesized audio. For example, wherein the at least one first sound source 152 at least partially includes recorded or synthesized audio. Certain embodiments of operation 2026 can include, but is not limited to, wherein the at least one first sound source at least partially includes a voice. For example, wherein the at least one first sound source 152 at least partially includes a voice, such as can be recognized in certain embodiments of the audio sound recognizer 162, as described with respect to FIG. 1. Certain embodiments of operation 2028 can include, but is not limited to, wherein the at least one second sound source at least partially includes an ambient sound. For example, the at least one second sound source 154 at least partially includes ambient sound. Certain embodiments of operation 2030 can include, but is not limited to, wherein the at least one second sound source at least partially includes a recorded or synthesized audio. For example, the at least one second sound source 154 at least partially includes recorded or synthesized audio. Certain embodiments of operation 2032 can include, but is not limited to, wherein the at least one second sound source at least partially includes a voice. For example, the at least one second sound source 154 at least partially includes a voice, or multiple voices, such as which the user may not wish to emphasize as described with respect to FIG. 1. Certain embodiments of operation 2034 can include, but is not limited to, wherein the at least one audio source is presented over a headphone. For example, wherein the at least one audio source is provided over a headphone or other personal device, as described with respect to FIG. 3. Certain embodiments of operation 2036 can include, but is not limited to, wherein the at least one audio source is presented over a speaker system. For example, wherein the at least one audio source is provided over a speaker or other group audio/sound device, as described with respect to FIG. 4. Certain embodiments of operation 2038 can include, but is not limited to, wherein the at least one audio source is presented over an audio system. For example, wherein the at least one audio source is provided over a group audio/sound device, as described with respect to FIG. 4. Certain embodiments of operation 2040 can include, but is not limited to, wherein the at least some specific information includes at least some specific frequency information, specific spectral content information, or specific recognition-based information. For example, wherein the at least some specific information can include the at least some specific frequency information, specific spectral content information, or specific recognition-based information, which can be maintained in certain embodiments of the audio sound library 160, and can be recognized in certain embodiments of the audio/sound recognizer 162, as described with respect to FIG. 1 in this disclosure. The order of the operations, methods, mechanisms, etc. as described with respect to FIG. 10 (including FIGS. 10a to 10c) is intended to be illustrative in nature, and not limited in scope.

Figure 11C:
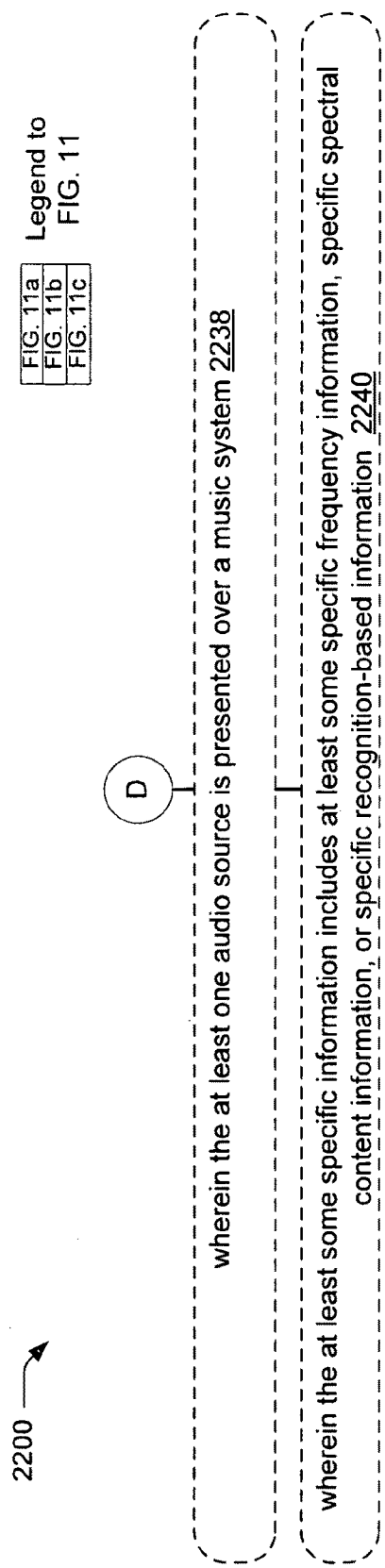
FIG. 11 (including FIGS. 10a, 11b, and 11c) is a flow chart of one embodiment of a technique such as can be performed by certain embodiments of the audio/sound device.

Certain embodiments of a high-level flowchart of a audio/sound technique 2200 is described with respect to FIG. 11 (including FIGS. 11a to 11c) and can include, but is not limited to, operations 2202 and 2204, and optional operations 2220, 2222, 2224, 2226, 2228, 2230, 2232, 2236, 2238, and/or 2240. Certain embodiments of operations 2004 can include, but is not limited to, optional operation 2210, 2212, 2214, 2216, and/or 2218. The high-level flowchart of FIG. 11 (including FIGS. 11a to 11c) should be considered in combination with the embodiments of the audio/sound device 100, as described with respect to FIG. 1.

Certain embodiments of operation 2202 can include, but is not limited to, providing an at least one audio source to at least one user. For example, the at least one audio source 150 can be provided within certain embodiments of the audio/sound device 100, as described with respect to FIGS. 1 and 2. Certain embodiments of the audio/sound device 100 are described in this disclosure with respect to FIGS. 3 to 7. Certain embodiments of the audio/sound device can be configured to utilize hardware, firmware, and/or software versions of the audio/sound controller 97 as described in this disclosure. Certain embodiments of operation 2204 can include, but is not limited to, selectively modifying an at least one first sound source to be provided to the at least one user, wherein the at least one first sound source is combined with an at least one second sound source, and wherein the selectively modifying is performed relative to the at least one second sound source based at least in part on at least some specific information of the at least one first sound source. For example, certain embodiments of the at least one first sound source 152 can be modified relative to the at least one audio source 150. Certain embodiments of the modification can include, but are not limited to, amplification, maintaining, filtering, clarification, etc. Certain embodiments of the selectively modifying an at least one first sound source to be provided to the at least one user, wherein the at least one first sound source is combined with an at least one second sound source, and wherein the selectively modifying is performed relative to the at least one second sound source based at least in part on at least some specific information of the at least one first sound source of operation 2204 can include operation 2210, that can include but are not limited to, selectively reducing the at least one second sound source relative to the at least one first sound source. For example, wherein the selective modification of the at least one first sound source relative to the at least one second sound source can include, but is not limited to, reducing such as by diminishing the volume of the at least one second sound source 154 relative to the at least one first sound source 152 as described with respect to FIG. 1. Certain embodiments of operation 2204 can include operation 2212, that can include but are not limited to, selectively stopping the at least one second sound source relative to the at least one first sound source. For example, wherein the selective modification of the at least one first sound source relative to the at least one second sound source can include, but is not limited to, stopping the at least one second sound source as described with respect to FIG. 1. Certain embodiments of operation 2204 can include operation 2214, that can include but are not limited to, selectively filtering the at least one second sound source relative to the at least one first sound source. For example, wherein the selective modification of the at least one first sound source 152 relative to the at least one second sound source 154 can include, but is not limited to, selectively filtering the at least one second sound source relative to the at least one first sound source. Certain embodiments of operation 2204 can include operation 2216, that can include but are not limited to, selectively maintaining the at least one first sound source as the at least one second sound source is diminished or stopped. For example, the selective modification of the at least one first sound source relative to the at least one second sound source can include, but is not limited to, selectively maintaining the volume or other characteristics of the at least one sound source as the volume or other characteristics of the at least one second sound source is reduced or diminished as described with respect to FIG. 1.

Certain embodiments of operation 2220 can include, but are not limited to, further comprising reducing a volume of the at least one audio source at least partially in response to at least some outside classes of sound. For example, reducing the volume of the at least one audio source 150 such as is typically produced by certain embodiments of the audio/sound device 100 as described with respect to FIG. 1 in this disclosure, such as to allow the user to more easily discern the at least one first sound source 152 which may be a different class of sound or audio (originating outside of the audio/sound device) as compared with the at least one audio source 150. Certain embodiments of operation 2222 can include, but are not limited to, wherein the at least one first sound source at least partially includes a noise. For example, the at least one first sound source can include a noise such as a siren, alert, alarm, etc. that may be desired to be used to the user of the audio/sound device 100, or such as may be designed into the audio/sound device by its designers, producer, operator, etc. Certain embodiments of operation 2224 can include, but are not limited to, wherein the at least one first sound source at least partially includes a recorded or synthesized audio. For example, certain embodiments of the at least one first sound source 152 may be in the form of synthesized or recorded audio. Certain embodiments of operation 2226 can include, but are not limited to, wherein the at least one first sound source at least partially includes a voice. For example, certain embodiments of the at least one first sound source 152 may include a voice, such as one which the user wishes to hear. Alternatively, the at least one first sound source can include a voice of a speaker or performer that should be amplified or maintained to the user by certain embodiments of the audio/sound device. Certain embodiments of operation 2228 can include, but are not limited to, wherein the at least one second sound source at least partially includes an ambient sound. For example, certain embodiments of the at least one second sound source can include ambient sound, noises, voices, which the user may desire to be diminished relative to the at least one first sound source. Certain embodiments of operation 2230 can include, but are not limited to, wherein the at least one second sound source at least partially includes a recorded or synthesized audio. For example, certain embodiments of the at least one second sound source 154 at least partially includes a recorded or synthesized audio, such as which may be desired to be relatively diminished relative to the at least one first sound source 152. Certain embodiments of operation 2232 can include, but are not limited to, wherein the at least one second sound source at least partially includes a voice. For example, certain embodiments of the at least one second sound source 154 as described with respect to FIG. 1 can include one or more voices that can be relatively diminished compared to other voices, noises, information, etc. that can be characterized as the at least one first sound source. Certain embodiments of operation 2234 can include, but are not limited to, wherein the at least one audio source is presented over a headphone. For example, certain embodiments of the at least one audio source 150 can be presented over certain personal embodiments of the audio/sound device 100 that can be configured as a headphone. Certain embodiments of operation 2236 can include, but are not limited to, wherein the at least one audio source is presented over a speaker system. For example, certain embodiments of the at least one audio source 150 can be presented over certain group-based embodiments of the audio/sound device 100 that can be configured as a speaker system. Certain embodiments of operation 2238 can include, but are not limited to, wherein the at least one audio source is presented over a music system. For example, certain embodiments of the at least one audio source 150 can be presented over certain embodiments of the audio/sound device 100 that can be configured as a music system, such as an IPOD, an MP3 player, a surround-sound system, or a concert system. Certain embodiments of operation 2240 can include, but are not limited to, wherein the at least some specific information includes at least some specific frequency information, specific spectral content information, or specific recognition-based information. For example, there may be a variety of classifications of the at least some specific information for certain embodiments of the audio/sound device as described with respect to FIG. 1 that can include, but are not limited to, at least some specific frequency information, specific spectral content information, or specific recognition-based information.

In one or more various aspects, related systems include but are not limited to circuitry and/or programming for effecting the herein-referenced method aspects; the circuitry and/or programming can be virtually any combination of hardware, software, electro-mechanical system, and/or firmware configurable to effect the herein-referenced method aspects depending upon the design choices of the system designer.

CONCLUSION

This disclosure provides a number of embodiments of the audio/sound device 100. The embodiments of the audio/sound as described with respect to this disclosure are intended to be illustrative in nature, and not limiting its scope.

Those having skill in the art will recognize that the state of the art in computer, controller, communications, networking, and other similar technologies has progressed to the point where there is little distinction left between hardware, firmware, and/or software implementations of aspects of systems, such as may be utilized in certain embodiments of the audio/sound device. The use of hardware, firmware, and/or software can therefore generally represent (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle can vary with the context in which the processes and/or systems and/or other technologies are deployed. For example, if an implementer determines that speed and accuracy are paramount, the implementer and/or designer of certain embodiments of the audio/sound device may opt for mainly a hardware and/or firmware vehicle. In alternate embodiments, if flexibility is paramount, the implementer and/or designer may opt for mainly a software implementation. In yet other embodiments, the implementer and/or designer may opt for some combination of hardware, software, and/or firmware. Hence, there are several possible techniques by which the processes and/or devices and/or other technologies described herein may be effected, none of which is inherently superior to the other in that any vehicle to be utilized is a choice dependent upon the context in which the personalized device can be deployed and the specific concerns (e.g., speed, flexibility, or predictability) of the implementer, any of which may vary.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated. Circuits (ASICs), Field Programmable Gate Arrays (FPGAs), Digital Signal Processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

All of the above U.S. patents, U.S. patent application publications, U.S. patent applications, foreign patents, foreign patent applications and non-patent publications referred to in this specification and/or listed in any Application Data Sheet, are incorporated herein by reference, in their entireties.

It is to be understood by those skilled in the art that, in general, the terms used in the disclosure, including the drawings and the appended claims (and especially as used in the bodies of the appended claims), are generally intended as "open" terms. For example, the term "including" should be interpreted as "including but not limited to"; the term "having" should be interpreted as "having at least"; and the term "includes" should be interpreted as "includes, but is not limited to"; etc. In this disclosure and the appended claims, the terms "a", "the", and "at least one" positioned prior to one or more goods, items, and/or services are intended to apply inclusively to either one or a plurality of those goods, items, and/or services.

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that could have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that could have A alone, B alone, C alone, A and B together, A and C together, B and C together, and/or A, B, and C together, etc.).

Those skilled in the art will appreciate that the herein-described specific exemplary processes and/or devices and/or technologies are representative of more general processes and/or devices and/or technologies taught elsewhere herein, such as in the claims filed herewith and/or elsewhere in the present application.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A system comprising:
  circuitry for receiving information associated with a first sound originating from at least one environmental source and information associated with a second sound originating from another environmental source; and
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the recording of the first sound originating from at least one environmental source when the second sound originating from at least another environmental source is at least one of diminished or stopped.

2. The system of claim 1, wherein the circuitry for receiving information associated with a first sound originating from at least one environmental source and information associated with a second sound originating from another environmental source comprises:
  circuitry for receiving information associated with at least one device sound originating from at least one environmental source.

3. The system of claim 1, wherein the circuitry for receiving information associated with a first sound originating from at least one environmental source and information associated with a second sound originating from another environmental source comprises:
  circuitry for receiving information associated with at least one speech sound originating from at least one environmental source.

4. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined user-specified characteristic, signaling for de-emphasis of at least some audio being output by at least one audio device.

5. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source is associated with sound information of at least one sound library and, if the information associated with the first sound originating from at least one environmental source is associated with sound information of at least one sound library, signaling for de-emphasis of at least some audio being output by at least one audio device.

6. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
   circuitry for processing the information associated with the first sound originating from at least one environmental source and the information associated with the second sound originating from at least another environmental source by determining whether the information associated with the first sound originating from at least one environmental source is associated with sound information of at least one voice library and, if the information associated with the first sound originating from at least one environmental source is associated with sound information of at least one voice library, signaling for de-emphasis of at least some audio being output by at least one audio device.

7. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
   circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some recorded audio being output by at least one audio device.

8. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
   circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audiovisual content being output by at least one audiovisual device.

9. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
   circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio of at least some audiovisual content being output by at least one audiovisual device.

10. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:

circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio being output by at least one audio device by emphasis of the at least one sound.

11. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:

circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio being output by at least one audio device without amplification of the at least one sound.

12. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:

circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for emphasis of the at least one sound and de-emphasis of at least some audio being output by at least one audio device.

13. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:

circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for volume reduction of at least some audio being output by at least one audio device.

14. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:

circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for pausing of at least some audio being output by at least one audio device.

15. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio being output by at least one audio device during a duration of the at least one sound.

16. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for temporary de-emphasis of at least some audio being output by at least one audio device.

17. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio being output by at least one personal audio player.

18. The system of claim 1, wherein the circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the first sound originating from at least one environmental source when the second sound originating from at least another environmental source is at least one of diminished or stopped comprises:
  circuitry for processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes at least one predetermined characteristic, signaling for de-emphasis of at least some audio being output by at least one entertainment system.

19. A method comprising:
receiving information associated with a first sound originating from at least one environmental source and information associated with a second sound originating from another environmental source; and
processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the recording of the first sound originating from at least one environmental source when the second sound originating from at least another environmental source is at least one of diminished or stopped.

20. One or more non-transitory media bearing one or more instructions for facilitating operations comprising:

receiving information associated with a first sound originating from at least one environmental source and information associated with a second sound originating from another environmental source; and processing the information associated with the first sound originating from at least one environmental source and the information associated with the second sound originating from at least another environmental source by determining whether the information associated with the first sound originating from at least one environmental source includes at least one predetermined characteristic and, if the information associated with the first sound originating from at least one environmental source includes the at least one predetermined characteristic, recording the first sound originating from at least one environmental source and playing back the recording of the first sound originating from at least one environmental source when the second sound originating from at least another environmental source is at least one of diminished or stopped.

\* \* \* \* \*